United States Patent [19]
Avrutsky et al.

[11] Patent Number: 6,141,370
[45] Date of Patent: Oct. 31, 2000

[54] SUPERIMPOSED GRATING WDM TUNABLE LASERS

[75] Inventors: Ivan Avrutsky, Warren, Mich.; Hanan Anis, Kanata, Canada; Toshi Makino, Nepean, Canada; Jingming Xu, Oakville, Canada

[73] Assignee: Northern Telecom Limited, Montreal, Canada

[21] Appl. No.: 09/253,129

[22] Filed: Feb. 19, 1999

[30] Foreign Application Priority Data

Feb. 20, 1998 [CA] Canada .................................. 2228683

[51] Int. Cl.$^7$ ...................................................... H01S 3/08
[52] U.S. Cl. ............................... 372/102; 372/96; 372/20
[58] Field of Search .............................. 372/102, 96, 20, 372/98, 99, 32; 385/37, 124

[56] References Cited

U.S. PATENT DOCUMENTS

| | | | |
|---|---|---|---|
| 5,299,212 | 3/1994 | Koch et al. ................................ | 372/32 |
| 5,457,760 | 10/1995 | Mizrabi ..................................... | 385/37 |
| 5,475,780 | 12/1995 | Mizrabi ..................................... | 385/37 |
| 5,673,129 | 9/1997 | Mizrabi .................................... | 359/124 |

OTHER PUBLICATIONS

Minier et al., "Diffraction Characteristics of Superimposed Holographic Gratings in Planar Optical Waveguides", IEEE Photonics Technology Letters, vol. 4, No. 10, pp. 1115–1118, (Oct. 1992).

Minier, et al., "Superimposed Phase Gratings in Planar Optical Waveguides for Wavelength Demultiplexing Applications", IEEE Photonics Technology Letters, vol. 5, No. 3, pp. 330–333, (Mar. 1993).

(List continued on next page.)

*Primary Examiner*—Leon Scott, Jr.
*Attorney, Agent, or Firm*—Foley & Lardner

[57] ABSTRACT

A superimposed grating tunable WDM semiconductor laser is provided comprising a grating structure is a binary superimposed grating comprising a plurality of segments of equal dimension, s, each segment having one of two values of refractive index, whereby the grating structure is provided by a binary modulation of the refractive index modulation of segments s along the length of the grating.

Thus, for a superimposed grating structure for an optoelectronic device for providing a spectrum comprising j reflection peaks at wavelengths $\lambda_j$, the grating comprising a binary superimposed grating (BSG) having a sequence of a plurality of segments of equal size s, each segment of the sequence having a refractive index of one of two values wherein the effective waveguide index of the ith segment $n_i^0(\lambda)$ is allowed to be changed by $\Delta n \cdot (m-\frac{1}{2})$ with m=1 or m=0:

$$n_i^0(\lambda) = \begin{cases} n^0(\lambda) + \Delta n/2, & f(s \cdot (i-1/2)) > 0 \\ n^0(\lambda) - \Delta n/2, & f(s \cdot (i-1/2)) < 0 \end{cases} \quad (4)$$

where i=1,2,3 . . . is the segment number, for digital position i·s, $n^0(\lambda)$ is a waveguide effective index, including both waveguide and material dispersion, and the function f(x) is a weighted sum of sinusoidal functions of desirable period $\Lambda_j$ $$f(x) = \sum_{j=1}^{N} (a_j \sin(2\pi x / \Lambda_j))$$

and, periods $\Lambda_j$ relate to the spectral positions of reflection peaks $\lambda_j$ through the waveguide index $n^0(\lambda)$ $\Lambda_j = \lambda_j / 2n^0(\lambda_j)$ Thus each grating is defined in a truly binary fashion as a digitized binary representation of elements providing a sum of component functions. The structure is readily fabricated by electron beam lithography at normal resolution. The ease of fabrication makes this structure desirable for front and back reflectors for tunable WDM lasers for applications such as tunable lasers for telecommunications applications and provides for an extended tuning range with excellent performance characteristics.

8 Claims, 8 Drawing Sheets

OTHER PUBLICATIONS

Tohmori et al. "Broad–Range Wavelength–Tunable Superstructure Grating (SSG) DBR Lasers", IEEE Journal of Quantum Electronics, vol. 29, No. 6, pp. 1817–1823. (Jun. 1993).

Ishii et al. "Quasicontinuous Wavelength Tuning in Super–Structure–Grating (SSG) DBR Lasers", IEEE Journal of Quantum Electronics, vol. 32, No. 3, pp. 433–441, (Mar. 1996).

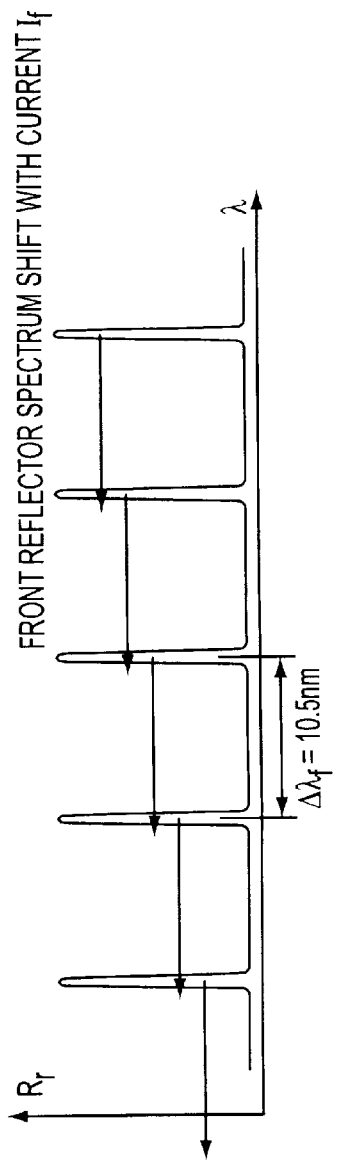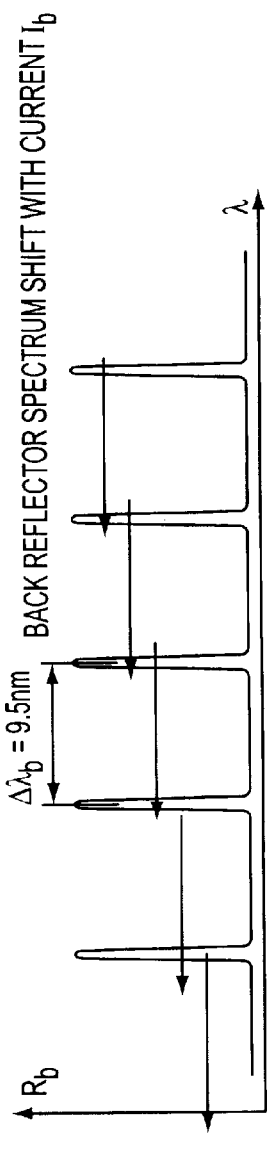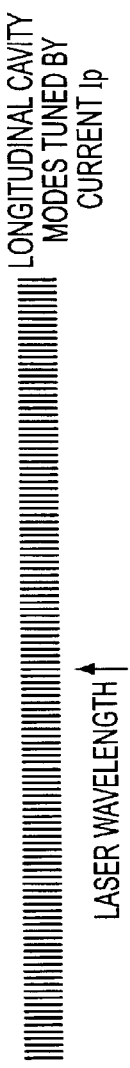
FIG. 8A
FIG. 8B
FIG. 8C
FIG. 8D

SUPERIMPOSED GRATING WDM TUNABLE LASERS

FIELD OF THE INVENTION

This invention relates to a superimposed grating structure for applications in tunable semiconductor lasers and other optoelectronic devices, and more particularly for WDM tunable lasers comprising superimposed grating structures.

BACKGROUND OF THE INVENTION

Wavelength tunable semiconductor lasers based on grating reflectors are promising devices for future telecommunications systems requiring an extended tuning range, e.g. for Wavelength Division Multiplexing (WDM) applications. While quasi-continuous electronic tuning over a range of 100 nm is possible, the tuning range of a single Distributed Bragg Reflector (DBR) grating is limited to about 10 nm.

The material refractive index of a semiconductor laser can be changed by current injection and thus the reflection peak of one set of gratings can be tuned over a certain range of wavelengths $\Delta\lambda$ of 10–20 nm. If the multiple reflection peaks of multiple m sets of gratings are spaced apart by roughly $\Delta\lambda$ in one DBR mirror, the corresponding peaks in the other DBR mirror are spaced slightly differently. Superimposed gratings provide several reflection peaks in the resulting diffraction spectrum or reflection spectrum. Superimposed gratings have therefore been used in a DBR region of a tunable laser to extend the tuning range of the lasing wavelength to several times that of a conventional single grating laser. Then the total tuning range is extended to $m\Delta\lambda$ which is broad enough for many applications. The total tuning range would be limited only by the material gain spectrum bandwidth, e.g. that of conventional 1.55 $\mu$m laser.

In efforts to improve the tuning range of DBR lasers, various types of multiple wavelength filters with comb-like reflectivity gratings have been demonstrated. These gratings provide a Fourier spectrum comprising an array of peaks. The simplest, most direct way to realize a grating structure with several peaks in the Fourier spectrum is to superimpose a few different gratings in a waveguide.

Superimposing gratings in a photosensitive glass is reported in a publication by V. Minier et al., entitled "Diffraction characteristics of superimposed holographic gratings in planar optical waveguides", in IEEE Photonics Technology Letters, Vol. 4, no. 10, October 1992. However, this technique is not practical to obtain superposition of gratings within a semiconductor material, where a grating is created by a photo-lithographic technique. In the latter multiple patterning and etching process steps are required.

For example, an analog superimposed grating (SG) structure from France Telecom is described in PCT Patent application WO 96/11416 published Apr. 18, 1996 entitled "Optical filter for a plurality of guided wavelengths". This structure includes a continuous grating in which every basic part comprises a plurality of gratings with periods corresponding to the various respective filter wavelengths. The several gratings are inscribed in a stack one above another in a single guide layer, or in a stack of guide layers. Earlier work on superimposed gratings was reported by one of the present inventors, in a paper by Minier et al., entitled "Superimposed phase gratings in planar optical waveguides for wavelength demultiplexing applications', in IEEE Photonics Technology Letters, vol. 5., No. 3 March 1993, which describes a coupled mode analysis of superimposed holographic gratings.

A comb-like reflection spectrum is also provided by a sampled grating, e.g. a structure comprising sections of grating alternating with grating free sections. However, a sampled grating is intrinsically unsuitable for equal amplitude reflections at multiple wavelengths, or when it is required that DBR zone is reasonably short, with a modest level of loss.

A superstructure grating may be constructed to provide a comb-like spectrum. In a grating of this type of structure, a parameter of the grating is modulated along the length of the grating, for example, in a linearly chirped grating where the pitch of the grating is modulated linearly along the length of the grating. Other known structures include a linearly stepped chirped grating, or a quadratic stepped phase chirped grating. These structures provides improved performance, but, patterning and fabrication of these grating structures is much is more complex. As described by NTT in IEEE J. Quantum electronics vol. 29, pp. 1817–1823, 1993; and IEEE J. Quantum Electronics, vol. 32, pp. 433–441, 1996, a superstructure grating (SSG) provides near maximum effective coupling coefficient for a given depth of index change, and permits adjustment of individual reflection peaks amplitudes. Nevertheless, the NTT SSG relies on super high precision (~1 nm) photolithography, requiring specialized processing equipment.

The SG and SSG structures mentioned above are believed to represent the best performance known to date, being suitable for broad >80 nm continuous tuning, and current efficient wavelength tuning. Nevertheless complex fabrication is required. For example the analog Superimposed Grating reported by France Telecom requires multiple etching steps, and multiple deposition and regrowth steps. Consequently manufacturing is relatively expensive and good reliability and yield require careful control of multiple process steps. On the other hand, super structure gratings rely on specialized precision lithography equipment.

Consequently there is a need for alternative grating structures which provide the required performance characteristics, preferably using lower cost, straightforward fabrication processes.

SUMMARY OF THE INVENTION

The present invention seeks to provide a grating structure for optoelectronic devices, with particular application in tunable semiconductor lasers, which overcomes or avoids the above mentioned problems.

Thus according to one aspect of the present invention a WDM semiconductor laser having a superimposed grating structure, the grating comprising a binary superimposed grating defined by a plurality of segments of equal dimension, s, each segment having one of two values of refractive index, whereby the grating structure is provided by a binary modulation of the refractive index of segments s along the length of the grating.

According to another aspect of the invention there is provided a DBR semiconductor laser structure comprising a superimposed grating structure, the grating structure comprising a binary superimposed grating (BSG) provided by a sequence of a plurality of segments of equal size s, each segment of the sequence having a refractive index of one of two values wherein the effective waveguide index of the ith segment $n_i^0(\lambda)$ is allowed to be changed by $\Delta n \cdot (m - \frac{1}{2})$ with m=1 or m=0:

$$n_i^0(\lambda) = \begin{array}{l} n^0(\lambda) + \Delta n/2, \ f(s \cdot (i-1/2)) > 0 \\ n^0(\lambda) - \Delta n/2, \ f(s \cdot (i-1/2)) < 0 \end{array} \quad (4)$$

where i=1,2,3 ... is the segment number, at digital position i·s, $n^0(\lambda)$ is a waveguide effective index, including both waveguide and material dispersion, and the function f(x) is a weighted sum of sinusoidal functions of desirable period $\Lambda_j$ $$f(x) = \sum_{j=1}^{N} (a_j \sin(2\pi x/\Lambda_j)) \quad (5)$$

and periods $\Lambda_j$ relate to the spectral positions of reflection peaks $\Lambda_j$ through the waveguide index $n^0(\lambda)$ $$\Lambda_j = \lambda_j / 2n^0(\lambda_j) \quad (6)$$

Thus a binary optics design provides a resulting grating pattern defined by the elements of the grating structure of two index values so that the resulting pattern looks like an irregular binary sequence 1100011101010.

In this way the complication of superposition of multiple gratings is done mathematically in defining a digital sequence of grating segments of the two index values.

Each segment of the grating is of a size that can be defined conveniently by a conventional fabrication method, e.g. electron beam lithography.

Thus the grating is an array of gratings (5) superimposed in an analogue manner, and then subjected to a binary digitization according to equation (4). The digitization effects a distortion of the analog grating performance. Thus the factors $\alpha_j$ are varied to obtain a desirable relation between the reflection peaks. This can be done by a traditional numerical optimization scheme, or by a more elegant analytical formulation.

The completed design of the binary grating looks like a grating of a period p.s where p is an integer number p=round $(\Lambda_0/s)$ and a phase shift of $\pm(2\pi/\Lambda_0)s$ is introduced where required in accordance with equations (4) and (5). A main advantage of the binary superimposed grating reflector is its totally binary nature that is easier to implement, and is more reproducible by a standard electron beam lithography.

For example the grating may comprise elements of length s each comprising a segment of a first material having a first index and a second material having a second index. The resulting binary sequence of values may be readily patterned by conventional e beam lithography, and the structure may be fabricated by a single etching step, to define the required pattern in the first material, thus removing selected regions of the first material to be replaced with regions of a second material. The latter may be provided in a single deposition step.

The grating structure has particular application for wavelength tuning of a WDM DBR semiconductor laser. The BSG structure may also be adapted for other applications in other optoelectronic devices.

The BSG provides a comb like reflection spectrum, and provides advantages of both SG and SSG gratings in a structure that is relatively straightforward to manufacture. For example, in contrast with a SSG, it provides the highest possible effective coupling coefficient with a given depth of index change. Like a SSG, it provides for adjustment of individual reflection peak amplitudes.

The BSG performance is as good as a SSG, and the structure is much more easily fabricated. Consequently such gratings have commercial potential for ease of manufacture of wavelength tunable lasers, for such applications as WDM applications.

Furthermore, due to the totally binary nature of this structure, the BSG is technologically much less difficult to implement and fully compatible with electron beam lithography.

The BSG structure provides best known performance for a one etch one regrowth process using standard e beam lithography.

BRIEF DESCRIPTION OF THE DRAWINGS

FIG. 8A shows the front reflector spectrum shift for current $I_f$, FIG. 8B shows the back reflector spectrum shift with current $I_b$, and FIG. 8C shows the total reflection spectrum; and FIG. 8D shows the longitudinal cavity modes tuned by current $I_p$ of the laser structure comprising the binary grating structure of FIG. 7.

DETAILED DESCRIPTION OF THE EMBODIMENTS

Prior Art

Figure 1:
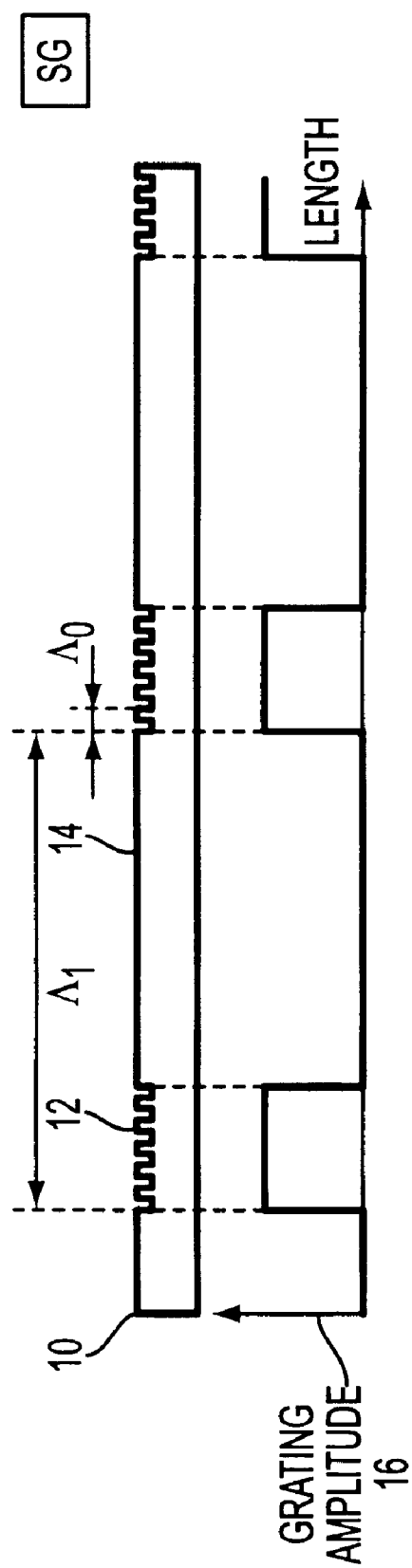
FIG. 1 shows a schematic cross section of a known prior art sampled grating (SG) structure.

The principle of a known prior art sampled grating 10, for example, as shown schematically in FIG. 1, is that the periodic modulation of the grating determines the separation between the channels. FIG. 1 shows a sampled grating comprising portions with large grating amplitude 12, and portions with zero grating amplitude 14 as shown by the graphical representation 16 showing the grating amplitude along the length of the grating 10. $\Lambda_0$ is the grating period or pitch width, and 79 $_1$ is the period of the function modulating the grating amplitude.

In a sampled grating structure (SG) 10 such as that shown schematically in FIG. 1, the sampled grating 10, is periodically modulated so that zones are periodically removed (ie. zero amplitude or grating free zone) in region 14. The period of modulation determines the spectral separation between the channels. For small duty cycles the number N of peaks in the reflectivity spectrum is equal approximately to the inverse of the duty cycle.

A large number of channels require a small duty cycle. Similarly, the amplitudes of peaks in the Fourier spectrum of SG are inversely proportional to the number of channels. In practice the length of a grating Lg is limited, at least, by factors such as absorption and current density. A current density of ~10 kA/cm² injection into InGaAsP ($\lambda$g=1.3 $\mu$m) InP based grating waveguides yields a reflection wavelength tuning range of about 8 nm in the 1.55 μm region. However, internal losses are increased from 8 to 50 cm$^{-1}$.

Assuming a coupling coefficient for the unremoved part of the grating 12 of $\kappa_0$ the number of channels N can be estimated from the relation:

$$(\kappa_0/N)L_g \approx 1 \tag{1}$$

Even for rather large values of $\kappa_0=150$cm$^{-1}$ and $L_g=500$ μm, the number of channels is about 7 or 8. A small duty cycle grating will result in small reflection peak amplitude and larger duty cycle will lead to narrowing of general reflection spectrum envelope, and reduction of the channel number.

The Fourier spectrum envelope for the SG is shaped like Sin(x)/x, and there are no free parameters to change the spectrum envelope shape other than scaling. Thus, reflection peaks are intrinsically of different amplitudes, and lasing in different bands of the range of tuning will have different threshold and efficiency, which is a clearly a significant disadvantage in tunable lasers for telecommunications applications.

The principle of a superstructure grating, SSG, is to provide a periodic modulation of a grating period or, equivalently, modulation of the grating phase. These gratings are also known as periodically chirped gratings. The spectral separation between channels, as for a superimposed grating, is determined by the modulation period. Design implementation of the structure consists of dividing the modulation period into a set of sub-sections, and filling each subsection with a grating of constant pitch width and depth, and in which the grating phase varies from section to section.

Figure 2:
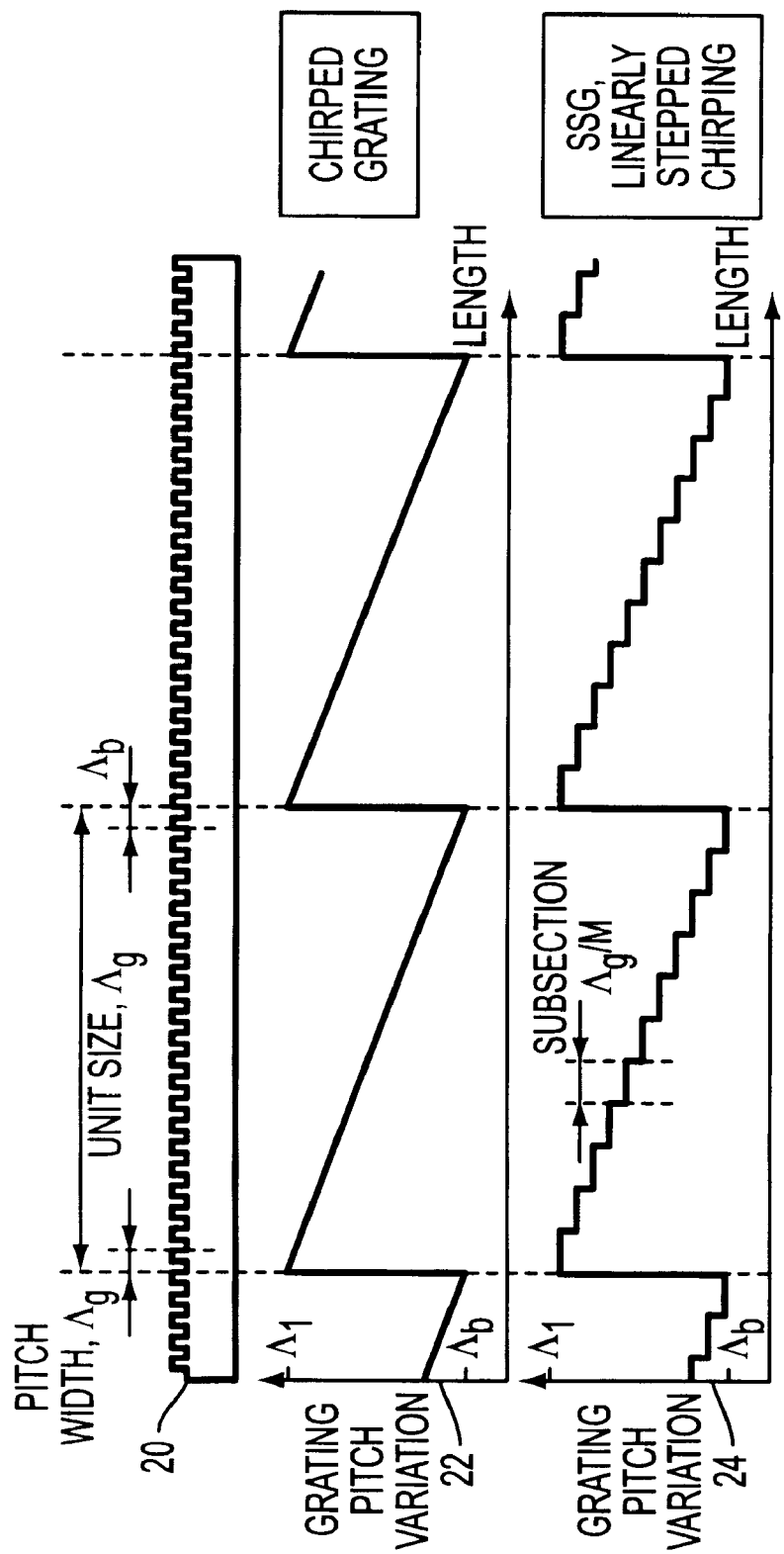
FIG. 2 shows a schematic cross section of a known prior art superstructure grating (SSG) structure comprising sections with linearly stepped chirp.
Figure 3:
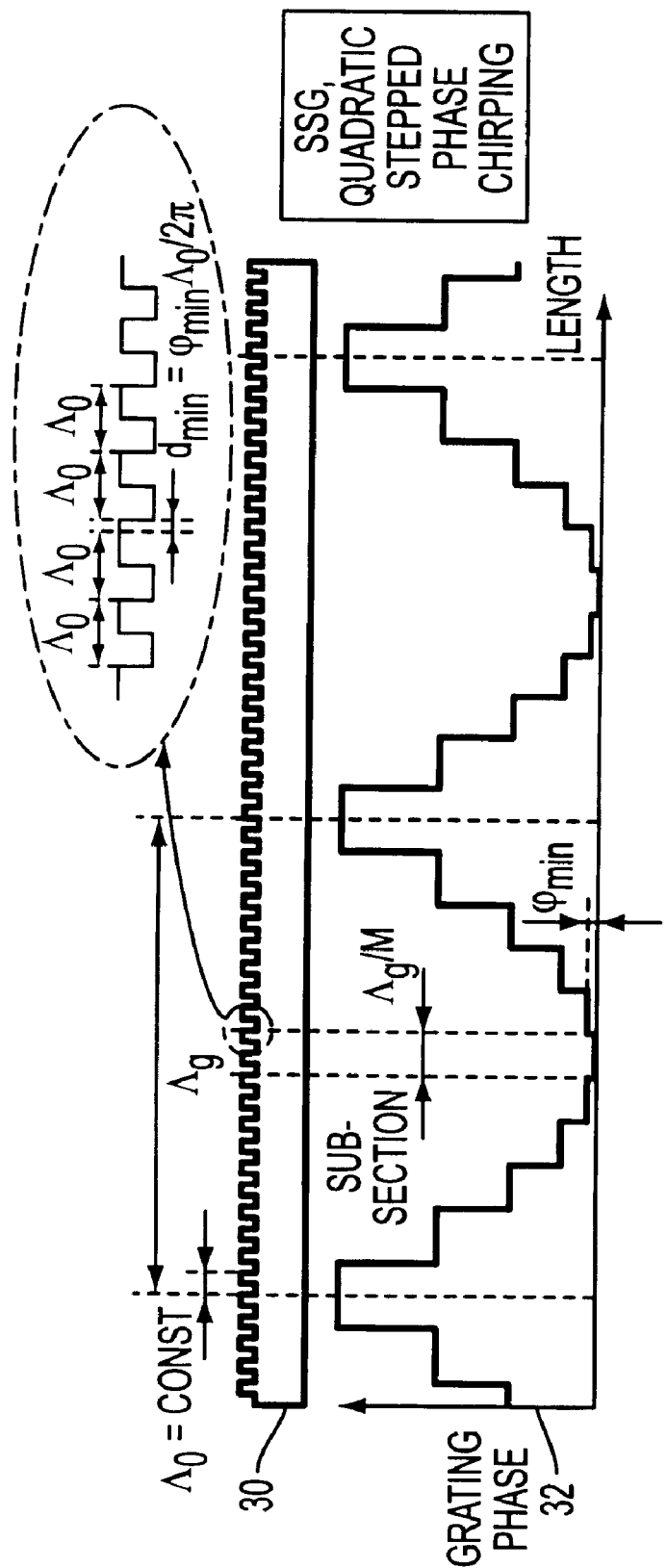
FIG. 3 shows a schematic cross section of a known prior art superstructure grating (SSG) structure comprising a quadratic stepped grating.

FIG. 2 shows examples of known superstructure gratings SSG, where the periodicity of the grating is modulated as shown by function 22 which shows a linearly chirped grating where the grating pitch varies continuously along the period of the modulation, and function 24 which is a linearly stepped grating, where the modulation is stepwise along the same period. FIG. 3 shows a SSG having a quadratic stepped phase grating 30, in which the grating pitch $\Lambda_0$ is constant, but a length $d_{min}$ of grating is introduced to create a specified phase shift at intervals determined by the grating phase function 32, resulting in a more complex periodic grating pattern.

The SSG does not contain grating free zones, as does the sampled grating SG described above. Thus the amplitudes of the peaks are larger than that of an SG of the same length, and the peaks decay with the number of channels as $1/\sqrt{N}$. The number of channels available with SSG may be found from the equation:

$$(\kappa_0/\sqrt{N})L_g \approx 1 \tag{2}$$

Numerical adjustment of the grating phase or pitch width of subsections of the grating allows for construction of a SSG with reflection peaks having a highly uniform amplitude. Nevertheless, physical implementation of an SSG of desired uniformity requires extremely precise lithography to reproduce the designed ultrafine grating phase shifts of each section correctly. Not surprisingly, the measured transmittance spectrum may show a non uniformity of several dB, which corresponds to reflectance peaks non-uniformity of several percent.

To estimate the value of a linear grating shift $d_{min}=\phi_{min}\Lambda_0/2\pi$ corresponding to the phase difference between neighbouring subsections, suppose $\Lambda_a=\lambda^-_a/2n^0$ and $\Lambda_b=\lambda_b/2n^0$ are the maximum and minimum values of the grating pitch width respectively, where $\lambda_a \sim 1600$ nm and $\lambda_b \sim 1500$ nm are optimistic estimates of the spectral boundaries of the reflection spectrum envelope, and $n \sim 3.2$ is the waveguide modal index. In the region of wavelength $\lambda \sim 1550$ nm, the desirable spectral separation between adjacent reflection peaks $\Delta\lambda=10$ nm and the equivalent waveguide index, which takes into account the effective index dispersion, $$n_{eq} = n^0 - \lambda_0 \frac{dn^0}{d\lambda} \approx 3.6 \text{nm}$$

determine the period of the grating modulation $\Lambda_s=\lambda_0^2/2n_{eq}\Delta\lambda \approx 33$ μm. To achieve a linear change in the grating period one needs a parabolic distribution of the subsection phase with respect to the section position. The necessary phase shift between neighbouring sections is equal to $d_{min}=(\Delta\Lambda/\Lambda_0)(\Lambda_s/M^2)$ in units of length where M is a number of sections in one period and $\Delta\Lambda=|\Lambda_a-\Lambda_b|$, $\Lambda_0=(\Lambda_a+\Lambda_b)/2$.

In practice imprecision of section phases by $d_{min} \sim 1$ nm will fail to produce the desired uniformity of reflection peak amplitudes. This presents a significant challenge in manufacturing such structures with sufficient precision to obtain reliable operation and good yield.

The embodiments

Figure 4:
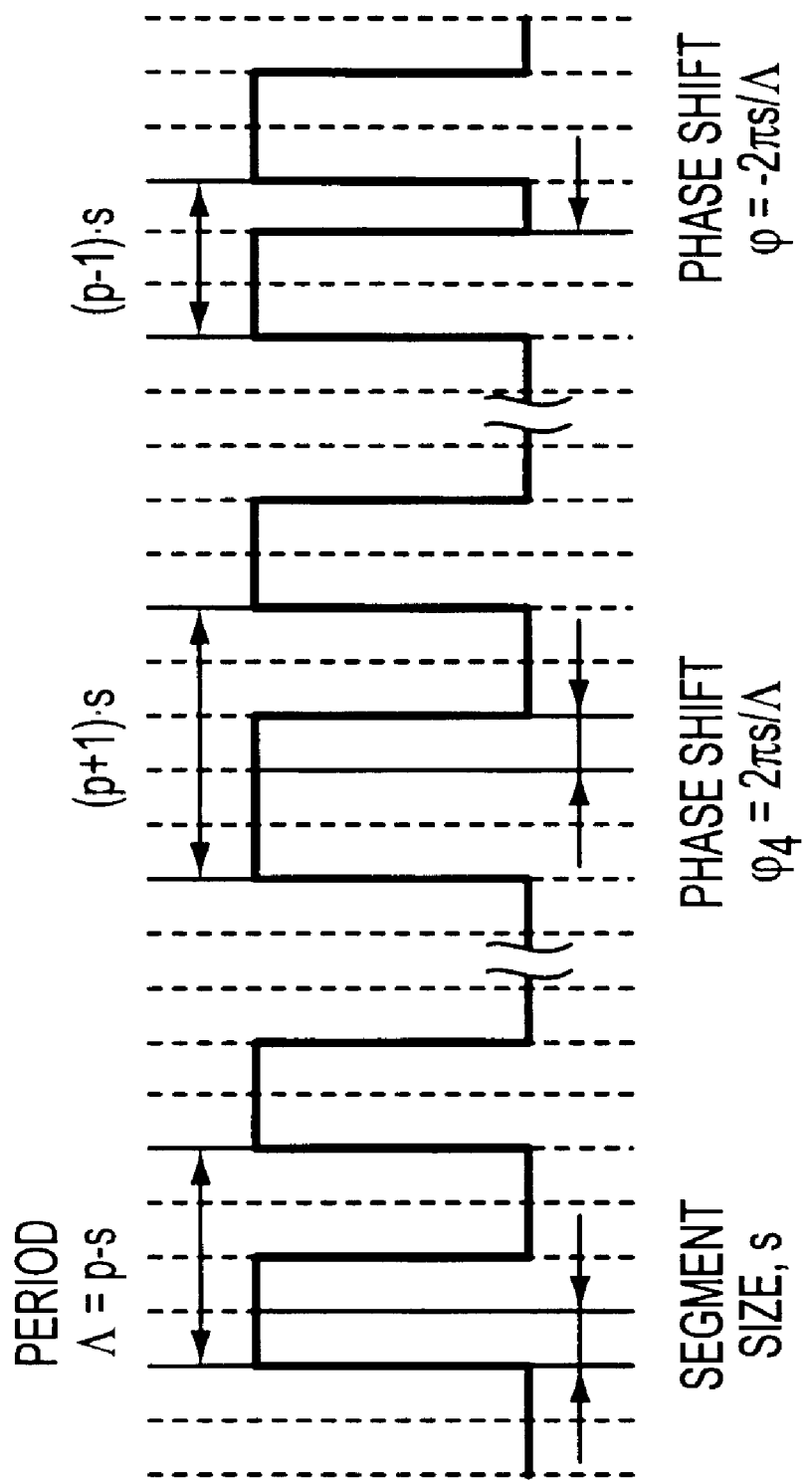
FIG. 4 shows a schematic cross section of part of a grating structure according to a first embodiment of the present invention.

A schematic cross section of part of a Binary Superimposed Grating (BSG) structure according to a first embodiment of the invention is shown in FIG. 4.

The grating consists of an array of segments which take one of two index values, like a binary sequence of 1s and 0s, each segment being of equal length s. The grating comprises a sequence of segments of uniform size s, in which are defined elements of period $\Lambda=p.s$, $(p+1).s$, and $(p-1).s$. The corresponding phase shift provided by respective elements is 0, $\phi+=2\pi s/\Lambda$ and $\phi-=2\pi s/\Lambda$.

Through a binary optics design, the grating is structured from a sequence of these simple elements which acts as multiple gratings superimposed in one layer, to provide the required comb like filter spectrum. The binary name comes from the fact that the resulting grating looks like an irregular digital sequence 100111000101 . . . In this way the complication of superposition is in generating the grating pattern, rather than in the fabrication. The mask layout and etching steps are done in a conventional way as for a DFB laser.

The effective waveguide index of the ith segment $n_i^0(\lambda)$ is allowed to be changed by $\Delta n \cdot (m-\frac{1}{2})$ with m=1 or m=0:

$$n_i^0(\lambda) = \begin{array}{l} n^0(\lambda) + \Delta n/2, \, f(s \cdot (i-1/2)) > 0 \\ n^0(\lambda) - \Delta n/2, \, f(s \cdot (i-1/2)) < 0 \end{array} \tag{4}$$

where i=1,2,3 . . . is the segment number (or digital position i·s), $n^0(\lambda)$ is a waveguide effective index including both waveguide and material dispersion and the function f(x) is a weighted sum of sinusoidal functions of desirable period $\Lambda_j$ $$f(x) = \sum_{j=1}^{N} (a_j \sin(2\pi x/\Lambda_j)) \tag{5}$$

The periods $\Lambda_j$ relate to the spectral positions of reflection peaks $\lambda_j$ through the waveguide index $n^0(\lambda)$ $$\Lambda_j = \lambda_j/2n^0(\lambda_j) \tag{6}$$

Thus the grating is an array of gratings (5) superimposed in an analogue manner, and then subjected to a binary digitization according to equation (4). The digitization effects a distortion of the analog grating performance. Thus the factors $\alpha_j$ are varied to obtain a desirable relation between the reflection peaks. This can be done by a traditional numerical optimization scheme, or by a more elegant analytical formulation.

The completed design of the binary grating looks like a grating of a period p.s where p is an integer number p=round $(\Lambda_0/s)$ and a phase shift of $\pm(2\pi/\Lambda_0)s$ is introduced where required in accordance with equations (4) and (5). A main advantage of the reflector is its totally binary nature that is easier to implement, and is more reproducible by a standard electron beam lithography.

Figure 5:
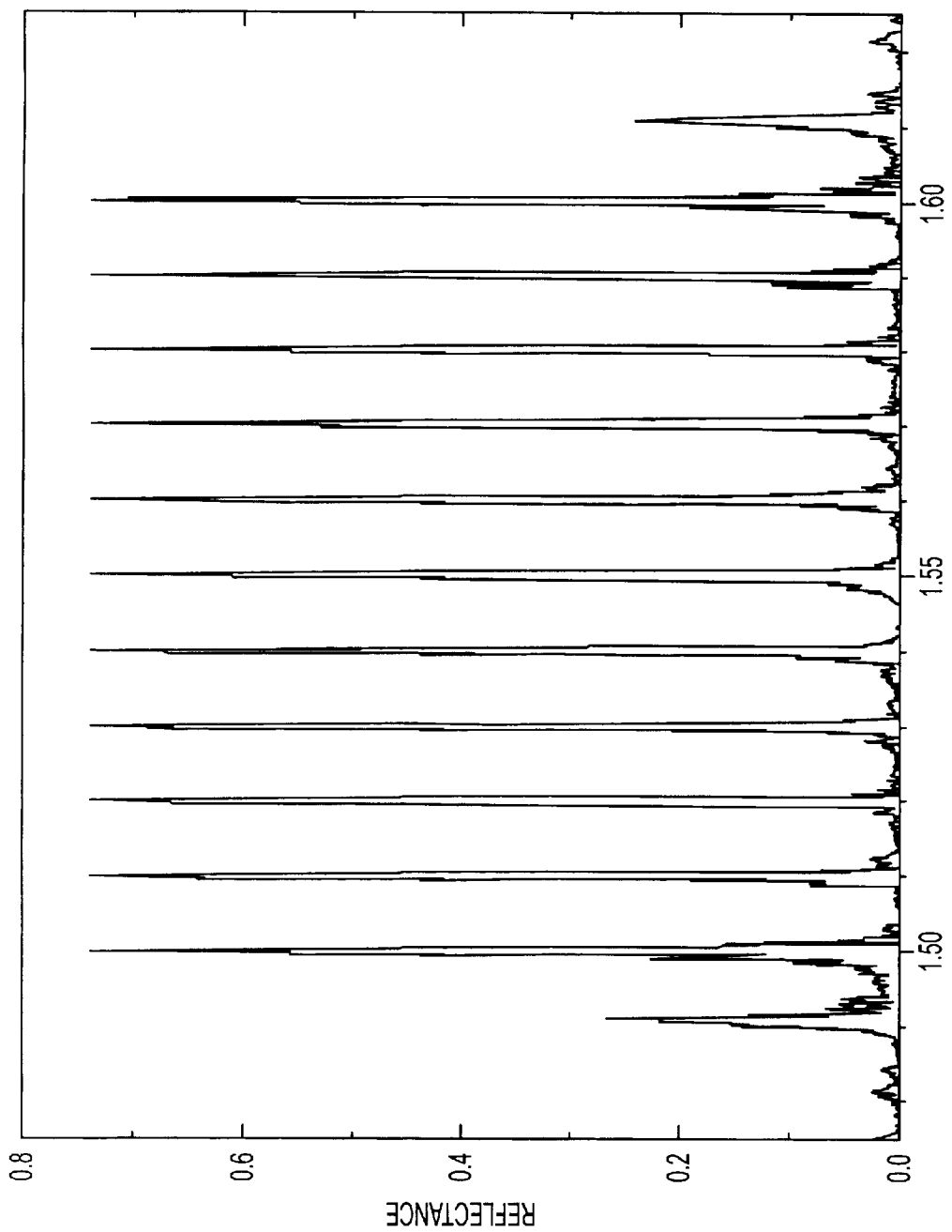
FIG. 5 shows the reflectance spectrum of the grating structure according to the first embodiment.
Figure 6:
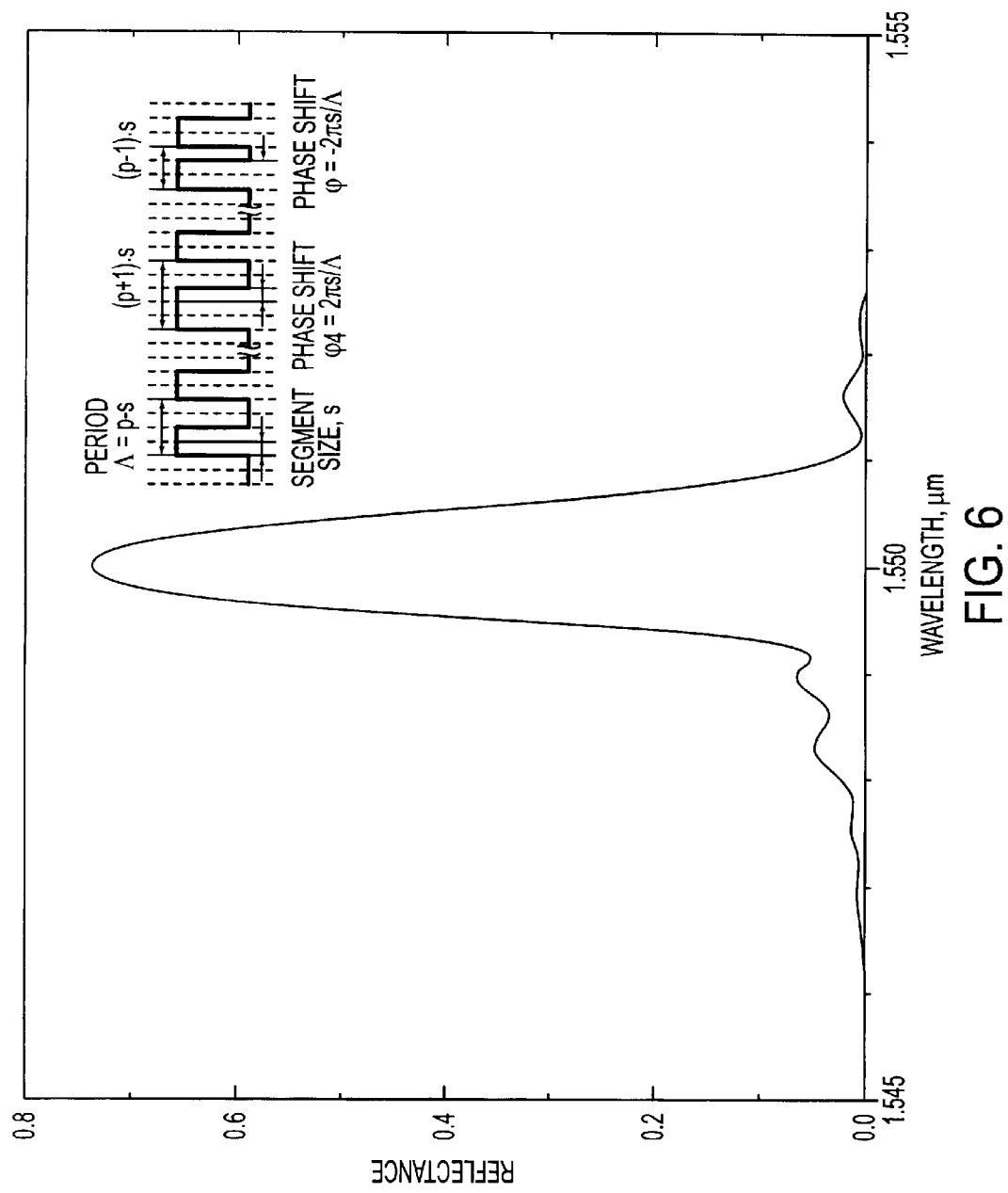
FIG. 6 shows part of the reflectance spectrum of FIG. 5 on an enlarged scale.

The reflectivity of an example BSG, calculated by the transfer matrix method is shown on FIG. 5 for a segment size s=0.05 $\mu$m, the grating length L=500 $\mu$m and an effective index change $\Delta n=8.10^{-3}$. The binary grating was designed for N=11 reflection peaks at $\lambda_1$=1500 nm, $\lambda_2$=1510 nm . . . $\lambda_{11}$=1600 nm. The waveguide index dispersion was $n_0$=3.2−2.6·$10^{-4}$·($\lambda$(nm)−1550).

The calculated non-uniformity $\delta$ of the reflectance peaks amplitude R, for l=1, . . . N is $\delta=\{(R_i-\langle R_l\rangle)^2\}^{1/2}/\langle R_l\rangle$ and was found to be $6\times10^{-4}$ after coarse optimization of coefficients $\alpha_j$. The width of the individual peaks equals FWNM=1 nm.

The values of parameters defined above are just one example to provide an extended tuning range around 1500 nm. Clearly parameters $\alpha_j$ may be varied to provide gratings with other spectral characteristics, as required.

The BSG provides a comb like reflection spectrum, and provides advantages of both SG and SSG gratings in a structure that is relatively straightforward to manufacture. For example, similar to a SSG, it provides a very high effective coupling coefficient for given depth of index change. Like a SSG, the design provides for adjustment of individual reflection peak amplitudes.

Figure 7:
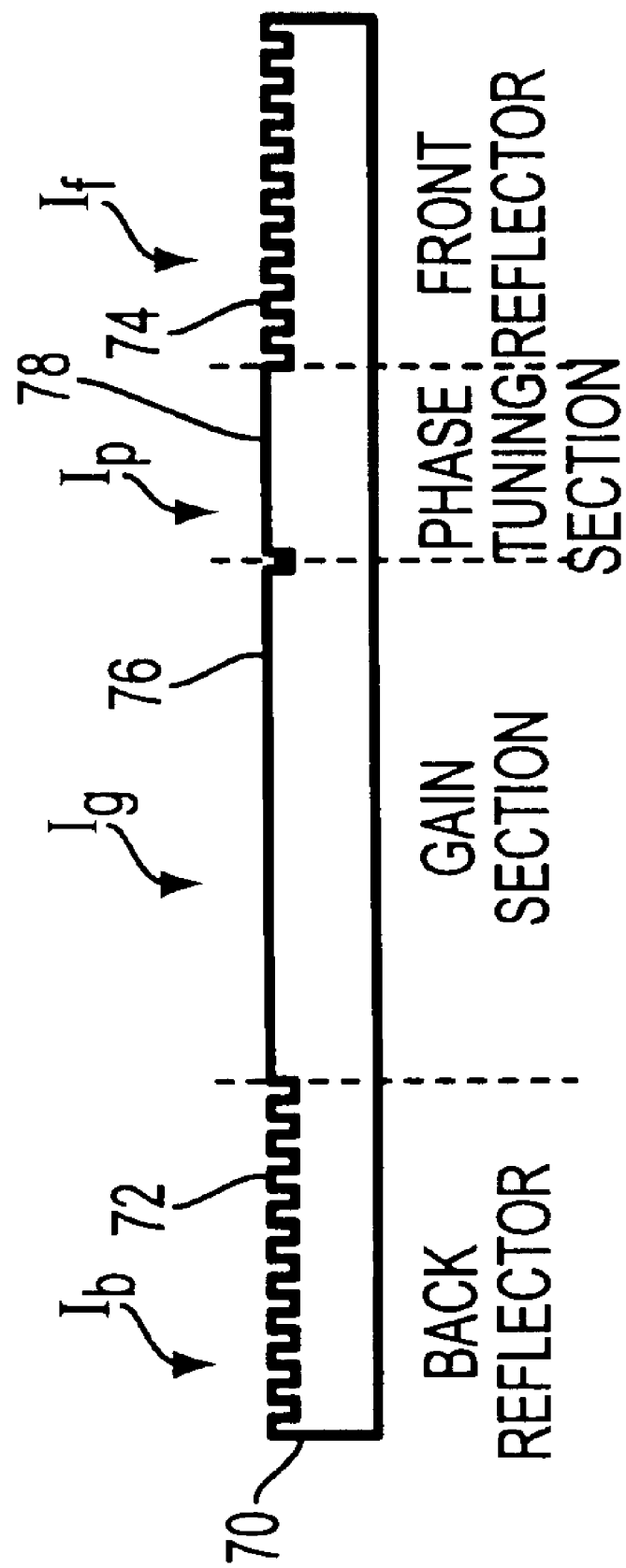
FIG. 7 shows schematically a DBR semiconductor laser structure comprising a binary superimposed grating structure according to a second embodiment of the present invention.

A schematic cross section through a tunable DBR laser structure having a grating structure according to a second embodiment of the present invention is shown in FIG. 7. The DBR laser structure includes a back reflector 72 comprising a first binary superimposed grating section tunable by current $I_b$, and a front reflector 74 comprising a second binary superimposed grating section tunable by current $I_f$, a gain section 76 tunable by current $I_g$, and a phase section 78 tunable by current $I_p$. FIG. 8A shows the front reflector spectrum shift for current $I_f$, and FIG. 8B shows the back reflector shift for current $I_b$. FIG. 8C shows the total reflection spectrum $R_fR_b$ and FIG. 8D shows the longitudinal cavity modes which may be tuned by current $I_p$. Consequently, high performance operation may be obtained from a DBR tunable laser comprising binary superimposed grating reflectors.

Thus the BSG performance is expected to be as good as a SSG, and the structure is much more easily fabricated. Consequently such gratings have commercial potential for ease of manufacture of wavelength tunable lasers, for such applications as WDM applications.

Furthermore, due to the totally binary nature of this structure, the BSG is technologically much less difficult to implement and fully compatible with electron beam lithography. The BSG structure provides best known performance for a one etch one regrowth process using standard e beam lithography.

The binary optics design provides a resulting grating pattern defined by the elements of the grating structure of two index values, so that the resulting pattern looks like an irregular binary sequence. In this way the complication of superposition of multiple gratings is done mathematically in defining a digital sequence of grating segments of the two index values. Each segment of the grating is of a size that can be defined conveniently by a conventional fabrication method, e.g. e beam lithography. After patterning the structure by conventional e beam lithography, the structure may be fabricated by a single etching step, to define the required pattern in a first material of index a, thus removing regions of the first material to be replaced with a second material of index b, which may be provided in a single deposition step.

The grating structure has particular application for wavelength tuning of a WDM DBR semiconductor laser. The BSG structure may also be adapted for other wavelength selective applications in other optoelectronic devices.

While particular embodiments have been described in detail above, it will be apparent to those skilled in the art, that numerous modifications and variations to these embodiments may be made within the scope of the following claims.

What is claimed is:

1. A superimposed grating structure for a wavelength tunable optoelectronic device, comprising a binary superimposed grating defined by a plurality of segments of equal dimension, s, each segment having one of two values of refractive index, whereby the grating structure is provided by a binary modulation of the refractive index of segments s along the length of the grating.

2. A structure according to claim 1 wherein the plurality of segments provide a sequence of elements of period $\Lambda$=p.s, (p+1).s, and (p−1).s, and the corresponding phase shift provided by respective elements is 0, $\phi+=2\pi s/\Lambda$ and $\phi-=-2\pi s/\Lambda$.

3. A superimposed grating structure for an optoelectronic device for providing a spectrum of j reflection peaks at wavelengths $\lambda_j$, a grating comprising a binary superimposed grating (BSG) having, a sequence of a plurality of segments of equal size s, each segment of the sequence having a refractive index of one of two values wherein the effective waveguide index of the ith segment $n_i^0(\lambda)$ is allowed to be changed by $\Delta n\cdot(m-\frac{1}{2})$ with m=1 or m=0:

$$n_i^0(\lambda) = \begin{matrix} n^0(\lambda) + \Delta n/2, & f(s\cdot(i-1/2)) > 0 \\ n^0(\lambda) - \Delta n/2, & f(s\cdot(i-1/2)) < 0 \end{matrix} \quad (4)$$

where i=1,2,3 . . . is the segment number, for digital position i·s, $n^0(\lambda)$ is a waveguide effective index, including both waveguide and material dispersion, and the function f(x) is a weighted sum of sinusoidal functions of desirable period $\Lambda_j$ $$f(x) = \sum_{j=1}^{N} (a_j\sin(2\pi x/\Lambda_j))$$

and, periods $\Lambda_j$ relate to the spectral positions of reflection peaks $\lambda_j$ through the waveguide index $n^0(\lambda)$ $$\Lambda_j=\lambda_j/2n^0(\lambda_j).$$

4. A structure according to claim 3 wherein the values of coefficients $a_j$ are selected to provide the required spectral characteristics of the grating structure.

5. A distributed Bragg reflector (DBR) semiconductor laser structure comprising front and back reflection grating structures, a gain section and a phase tuning section, for tuning over a range of j wavelengths $\lambda_j$, where j=1 to j, each grating structure being defined by a binary superimposed grating (BSG) comprising: a sequence of a plurality of grating segments of equal size s, each segment of the sequence having a refractive index of one of two values wherein the effective waveguide index of the ith segment $n_i^0(\lambda)$ is allowed to be changed by $\Delta n \cdot (m - \frac{1}{2})$ with m=1 or m=0:

$$n_i^0(\lambda) = \begin{array}{l} n^0(\lambda) + \Delta n/2, \ f(s \cdot (i - 1/2)) > 0 \\ n^0(\lambda) - \Delta n/2, \ f(s \cdot (i - 1/2)) < 0 \end{array} \quad (4)$$

where i=1,2,3 . . . is the segment number, for digital position i·s, $n^0(\lambda)$ is a waveguide effective index, including both waveguide and material dispersion, and the function f(x) is a weighted sum of sinusoidal functions of desirable period $\Lambda_j$ $$f(x) = \sum_{j=1}^{N} (a_j \sin(2\pi x / \Lambda_j))$$

and periods $\Lambda_j$ relate to the spectral positions of reflection peaks $\lambda_j$ through the waveguide index $n^0(\lambda)$ $$\Lambda_j = \lambda_j / 2n^0(\lambda_j).$$

6. A structure according to claim 5 wherein the values of coefficients $a_j$ are selected to provide the required spectral characteristics and relation between the spectral peaks of the reflection spectrum of the grating structure.

7. A structure according to claim 6 wherein the binary grating has a period p.s where p is an integer number p=round ($\Lambda_0$/s) and a phase shift of $\pm(2\pi/\Lambda_0)$s.

8. A method of fabricating superimposed grating structures for wavelength tunable optoelectronic devices comprising:

forming in a substrate a binary superimposed grating defined by a plurality of segments of equal dimension, s, each segment having one of two values of refractive index, thereby providing the grating structure by a binary modulation of the refractive index of segments s along the length of the grating.

* * * * *